United States Patent
Hwang et al.

(10) Patent No.: US 7,525,395 B2
(45) Date of Patent: Apr. 28, 2009

(54) STEP ATTENUATOR

(75) Inventors: Hyeon Seok Hwang, Gyunggi-do (KR); Yoo Sam Na, Seoul (KR); Moon Sun Kim, Gyunggi-do (KR); Byeong Hak Jo, Gyunggi-do (KR); Kyoung Seok Park, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 0 days.

(21) Appl. No.: 12/140,980

(22) Filed: Jun. 17, 2008

(65) Prior Publication Data
US 2009/0021331 A1  Jan. 22, 2009

(30) Foreign Application Priority Data
Jul. 19, 2007  (KR) ............... 10-2007-0072248

(51) Int. Cl.
*H01P 1/22*  (2006.01)

(52) U.S. Cl. .................. 333/81 R; 327/308
(58) Field of Classification Search .............. 333/81 A, 333/81 R; 327/308, 309
See application file for complete search history.

(56) References Cited

U.S. PATENT DOCUMENTS 6,489,856 B1* 12/2002 Weigand ............ 333/81 R
2006/0279376 A1* 12/2006 Ehlers et al. ............ 333/81 R

* cited by examiner

*Primary Examiner*—Stephen E Jones
(74) *Attorney, Agent, or Firm*—Lowe Hauptman Ham & Berner

(57) ABSTRACT

There is provided a step attenuator having two Pi-type attenuators and one bridged-T type attenuator that share some resistors. The step attenuator is used to prevent a reduction in frequency range caused by use of MOS transistors and reduce attenuation of signal power and frequency band by the MOS transistors, thereby obtaining a low attenuation value and reducing input and output mismatch.

6 Claims, 9 Drawing Sheets freq(500.0MHz to 10.00GHz)

STEP ATTENUATOR

CROSS-REFERENCE TO RELATED APPLICATIONS

This application claims the priority of Korean Patent Application No. 2007-0072248 filed on Jul. 19, 2007, in the Korean Intellectual Property Office, the disclosure of which is incorporated herein by reference.

BACKGROUND OF THE INVENTION

1. Field of the Invention

The present invention relates to a step attenuator, and more particularly, to a step attenuator that can obtain a small attenuation value with input and output matching even when small-sized resistors and CMOS switches are used, and has broadband characteristics so as to obtain an attenuation value having multiple steps.

2. Description of the Related Art

In general, an attenuator is a kind of electromagnetic component that is used when a signal having high power is input, to attenuate the power of the input signal to an appropriate size. In particular, a step attenuator capable of determining an attenuation value in multiple steps is widely used in various kinds of receivers, such as a CATV receiver, which has a wide dynamic range. As compared with an analog control attenuator, a digital step attenuator obtains a more accurate attenuation value and exhibits better performance in an environment where temperature changes. Further, the step attenuator consumes less power and has relatively smaller distortion than the analog attenuator. In particular, in integrated circuit (IC) design, it is very important to accurately control a level of input power and transmit the controlled input power to a next block. To this end, the step attenuator that provides accurate control is used.

Generally, a basic circuit configuration of an attenuator is divided into a T-type configuration, a Pi-type configuration, and a bridged-T type configuration. In FIGS. 1A to 1C, the three configurations are sequentially shown. A step attenuator according to the related art includes the basic circuit configurations of the attenuators, shown in FIGS. 1A to 1C, which are connected in series with each other, and switches that bypasses the individual circuit configurations. MOS transistors are generally used as the switches.

When the bypass MOS transistor used in the step attenuator according to the related art is in an on-resistance (RON) state, it can be represented by an equivalent model with a value close to a zero resistance. However, as the MOS has the value closer to 0Ω, the size of the MOS transistor needs to increase, which causes an increase in manufacturing costs. The increase in size thereof causes an increase in parasitic capacitance, which narrows its frequency range. As a result, it is very difficult to practically realize a value of 0Ω by the MOS transistor. In the actual circuit, attenuation caused by the MOS transistor cannot be avoided. Despite variations in manufacturing process and size, the MOS transistor in the RON state has a resistance of several to several tens of ohms. Insertion loss according to the resistance of the MOS transistor in the RON state can be obtained by the following Equation 1.

$$IL = -20\log\left[\frac{2Z_0}{2Z_0 + R_{eq}}\right] \quad \text{[Equation 1]}$$

In the Equation 1, $Z_0$ is input and output impedance, and $R_{eq}$ is an ON-resistance of the transistor. The unit of each of the two values is ohm. For example, when the input and output impedance is 50 ohms and the RON resistance is 10 ohms, the insertion loss is 0.827 dB.

Therefore, when the transistor is used to bypass a signal in the step attenuator, additional attenuation in the range of 1 to 3 dB occurs due to MOS transistors, parallel resistors, and various parasitic effects. For these reasons, it is very difficult to reduce the size of the step attenuator and realize a circuit that can obtain a small amount of attenuation of, for example, 5 dB.

SUMMARY OF THE INVENTION

An aspect of the present invention provides a step attenuator that can obtain a small attenuation value.

An aspect of the present invention also provides a step attenuator including: first and second resistors connected in series with each other between an input terminal and an output terminal; a first switch connected in parallel between both ends of one of the first and second resistors; a second switch having one end connected to the input terminal; a third resistor having one end connected to the other end of the second switch and the other end connected to a ground terminal; fourth and fifth resistors having one set of ends connected to a connection node between the first resistor and the second resistors and other set of ends connected to a ground terminal; and a third switch having one end connected to the output terminal; a sixth resistor having one end connected to the other end of the third switch and the other end connected to the ground terminal; a fourth switch having one end connected to one of the input terminal and the output terminal; and a seventh resistor having one end connected to the other end of the fourth switch and the other end connected to one terminal between the input and output terminals while the one terminal is not connected to the fourth switch.

Both of the second switch and the third switch may be open-circuited or short-circuited, and the fourth switch may be short-circuited or open-circuited in opposition to the second switch and the third switch.

The first switch may be open-circuited when the fourth switch is short-circuited.

The first resistor and the second resistor may have the same resistance.

The third to sixth resistors may have the same resistance.

The first to third switches may be MOS transistors.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1A:
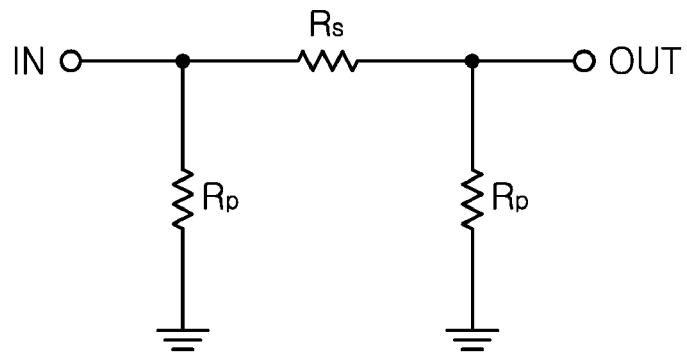
FIG. 1A to 1C are circuit diagrams illustrating respectively a structure of an attenuator according to the related art.
Figure 1B:
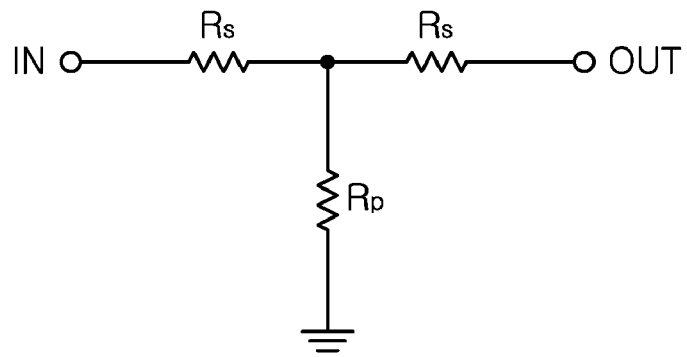
Figure 1C:
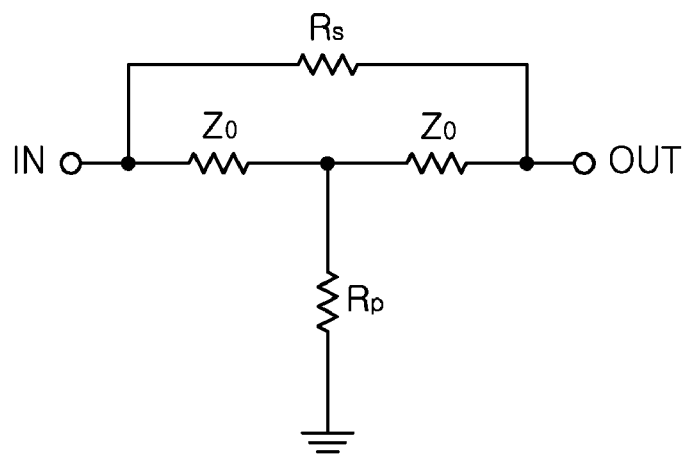

Exemplary embodiments of the present invention will now be described in detail with reference to the accompanying drawings.

The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity.

Figure 2:
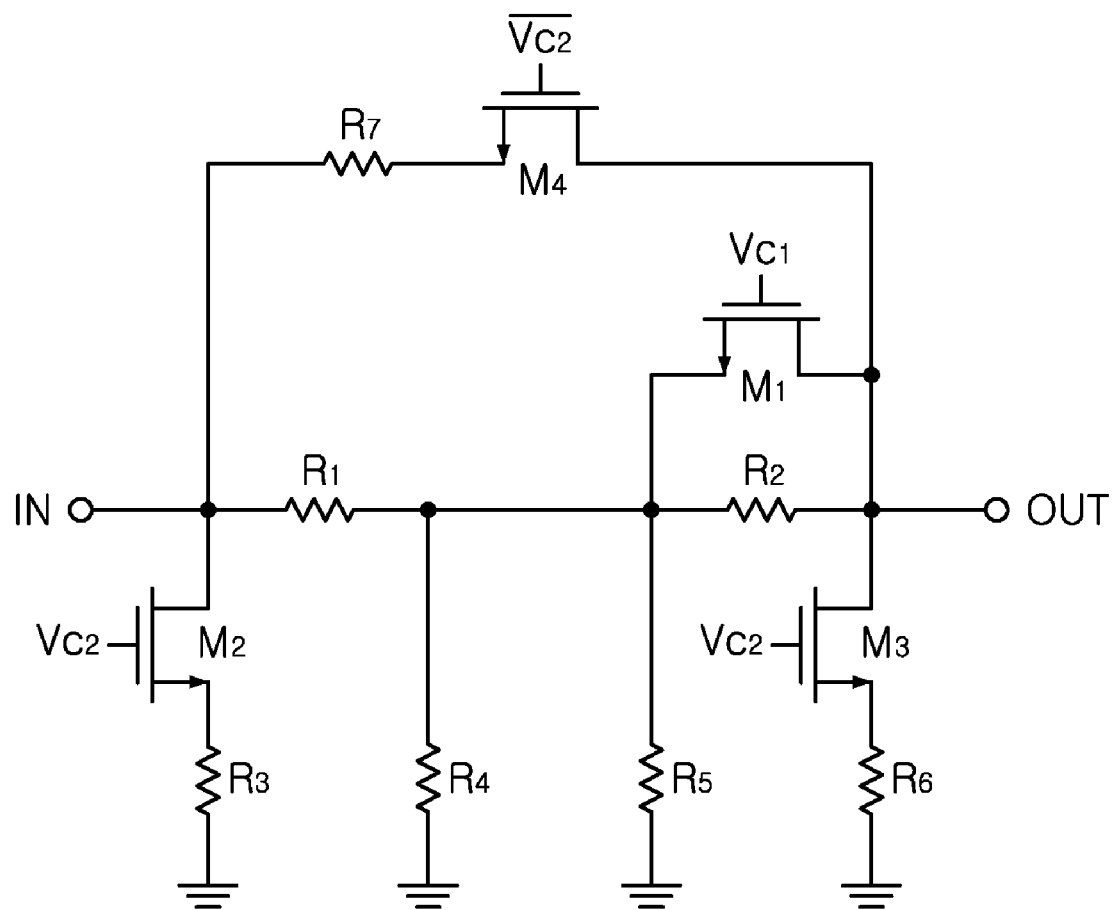
FIG. 2 is a circuit diagram illustrating a step attenuator according to an exemplary embodiment of the present invention.

FIG. 2 is a circuit diagram illustrating a step attenuator according to an exemplary embodiment of the invention.

As shown in FIG. 2, the step attenuator according to the embodiment of the invention includes a plurality of resistors $R_1$ to $R_7$ and switches $M_1$ to $M_4$. Specifically, the resistors and the switches are connected as follows.

The first resistor first resistor $R_1$ and the second resistor $R_2$ may be connected in series with each other between an input terminal IN and an output terminal OUTPUT.

The first switch $M_1$ may be connected in parallel between both ends of the second resistor $R_2$. In another embodiment of the invention, the first switch $M_1$ may be connected in parallel between both ends of the first resistor $R_1$. The first switch $M_1$ may be formed of a MOS transistor. Here, the MOS transistor includes a drain and a source that are connected to both ends of the second resistor $R_2$, respectively, and a gate that receives a control signal $V_{C1}$. For example, when the first switch $M_1$ is formed of an N-channel MOS transistor, if the control signal $V_{C1}$, is at a high level HIGH, the first switch $M_1$ is short-circuited, and if the control signal $V_{C1}$ is at a low level LOW, the first switch $M_1$ may be open-circuited.

The second switch $M_2$ has one end that may be connected to the input terminal IN. The third resistor $R_3$ has one end that may be connected to the other end of the second switch $M_2$ and the other end that may be connected to a ground terminal. Like the first switch $M_1$, the second resistor $R_2$ may include a MOS transistor. Here, the MOS transistor includes a drain and a source that may be connected to the input terminal IN and the one end of the third resistor $R_3$, respectively, and a gate that receives a control signal $V_{C2}$. For example, when the second switch $M_2$ is formed of an N-channel MOS transistor, if the control signal $V_{C2}$ is at a high level HIGH, the second switch $M_2$ may be short-circuited, and if the control signal $V_{C2}$ is at a low level LOW, the second switch M2 may be open-circuited.

The fourth resistor R4 and the fifth resistor R5 have one set of ends that may be connected to a connection node between to the first resistor R1 and the second resistor R2 and the other set of ends that may be connected to the ground terminal.

The third switch M3 has the one end that may be connected to the output terminal OUTPUT. The sixth resistor $R_6$ has one end that may be connected to the other end of the third switch $M_3$ and the other end that may be connected to the ground terminal. The one end of each of the first switch $M_1$ and the second switch $M_2$ may be connected to the input terminal IN. The third resistor $R_3$ has the one end that may be connected to the other end of the second switch $M_2$ and the other end that may be connected to the ground terminal. Like the first switch $M_1$ and the second switch $M_2$, the third switch $M_3$ may be formed of a MOS transistor. Here, the MOS transistor includes a drain and a source connected to the output terminal OUTPUT and the one end of the sixth resistor $R_6$, respectively, and a gate receiving the control signal $V_{C2}$. For example, when the third switch $M_3$ is formed of an N-channel MOS transistor, if the control signal $V_{C2}$ is at a high level HIGH, the third switch $M_3$ may be short-circuited, and if the control signal $V_{C2}$ is at a low level LOW, the third switch $M_3$ may be open-circuited.

The fourth switch $M_4$ has one end that may be connected to the output terminal OUTPUT. The seventh transistor $R_7$ may be connected between the other end of the fourth switch $M_4$ and the input terminal IN. In another embodiment, the fourth switch $M_4$ has the one end that may be connected to the input terminal IN, and the seventh resistor $R_7$ may be connected between the other end of the fourth switch $M_4$ and the output terminal OUTPUT.

Hereinafter, the operation of the invention will be described in detail with reference to the accompanying drawings.

Figure 3:
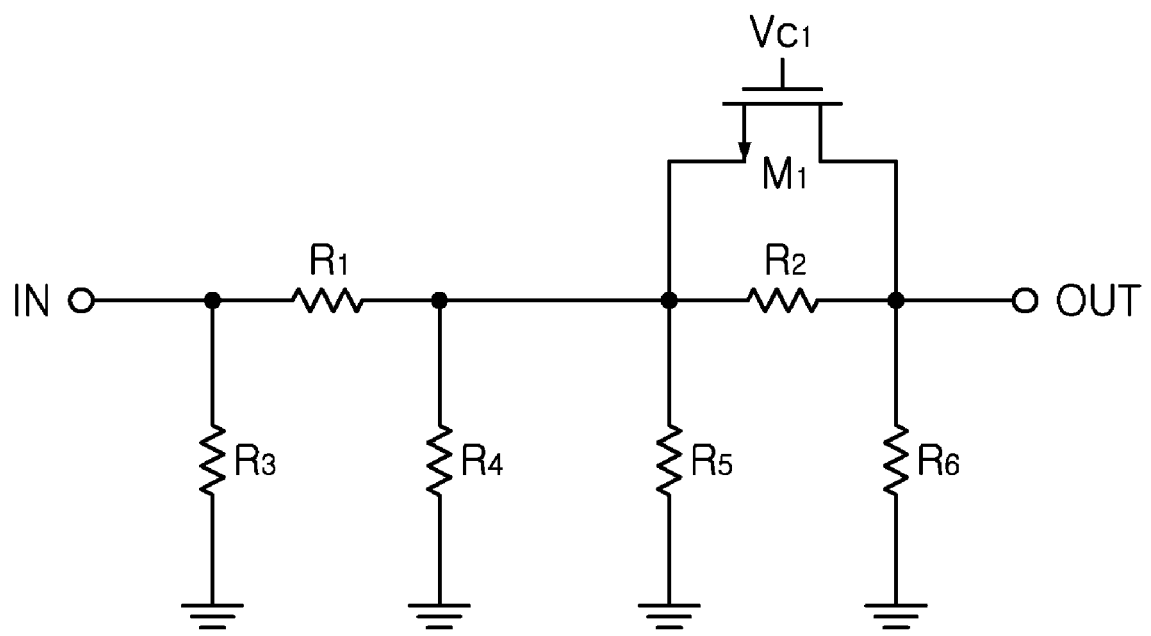
FIG. 3 is a circuit diagram illustrating two Pi-type attenuators according to the embodiment of the present invention.

FIG. 3 is a circuit diagram illustrating two Pi-type attenuators embodied according to an exemplary embodiment of the invention. That is, as shown in the circuit diagram of FIG. 3, the second switch $M_2$ and the third switch $M_3$ are short-circuited and the fourth switch $M_4$ is open-circuited according to the embodiment of the invention shown in FIG. 2. In the embodiment of the invention, both of the second switch $M_2$ and the third switch $M_3$ are either open-circuited or short-circuited, and the fourth switch $M_4$ is short-circuited or open-circuited in opposition to the second switch $M_2$ and the third switch $M_3$. That is, when the second to fourth switch $M_2$ to $M_4$ are formed of MOS transistors, the control signal $V_{C2}$ applied to the gate of the second switch $M_2$ or the third switch $M_3$ is inverse to a control signal $\overline{V_{C2}}$ applied to the gate of the fourth switch $M_4$.

As shown in FIG. 3, when the second switch $M_2$ and the third switch $M_3$ are short-circuited, and the fourth switch $M_4$ is open-circuited, a circuit configuration having two Pi-type attenuators connected in series with each other is formed.

Figure 4:
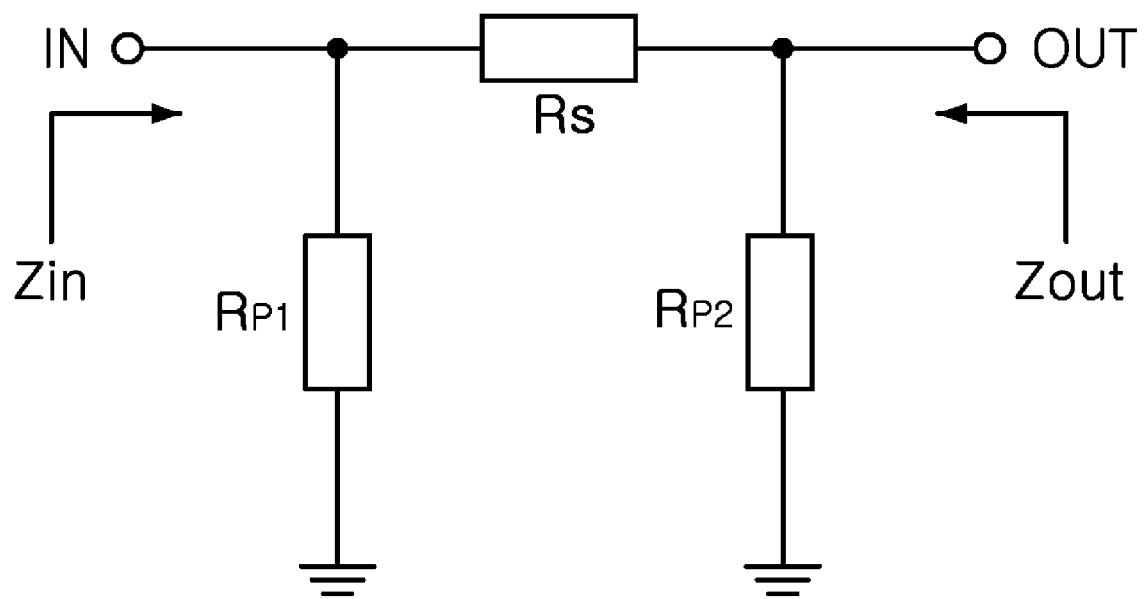
FIG. 4 is a diagram illustrating a method of determining a resistance according to an attenuation value of a Pi-type attenuator.

FIG. 4 is a diagram illustrating a method of determining a resistance according to an attenuation value of a Pi-type attenuator. In FIG. 4, Zin and Zout indicate input and output impedances, respectively. When a desired attenuation value and desired input and output impedance are determined, individual resistances of the Pi-type attenuators may be determined by the following Equations 2 to 4.

$$R_{P1} = \frac{1}{\frac{10^{\frac{L}{10}}+1}{Zin\left(10^{\frac{L}{10}}-1\right)} - \frac{1}{R_S}} \quad \text{[Equation 2]}$$

$$R_{P2} = \frac{1}{\frac{10^{\frac{L}{10}}+1}{Zout\left(10^{\frac{L}{10}}-1\right)} - \frac{1}{R_S}} \quad \text{[Equation 3]}$$

-continued $$R_S = \frac{1}{2}\left(10^{\frac{L}{10}} - 1\right)\sqrt{\frac{Zin \times Zout}{10^{\frac{L}{10}}}}$$ [Equation 4]

In the above Equations 2 to 4, L refers to the desired attenuation value in dB, and the unit of $R_{P1}$, $R_{P2}$, Zin, and Zout is in ohms $\Omega$.

For example, the present inventors have designed so that each of the first resistor $R_1$ and the second resistor $R_2$ has a resistance of 67.2$\Omega$, and each of the third resistor $R_3$ to the sixth resistor $R_6$ has a resistance of 196.2$\Omega$. In this way, the attenuator, shown in FIG. 3, has input and output impedance of 75$\Omega$ and each of the Pi-type attenuators has an attenuation of 7 dB. Here, when the first switch (MOS transistor) is short-circuited, an attenuation amount of 10 dB can be obtained by the attenuation amount of 7 dB of the Pi-type attenuator connected to the input terminal IN and an attenuation amount of 3 dB of the first switch itself. Further, when the first switch is open-circuited, an attenuation amount of approximately 15 dB can be obtained by the two Pi-type attenuators each having the attenuation amount of 7 dB.

Figure 5:
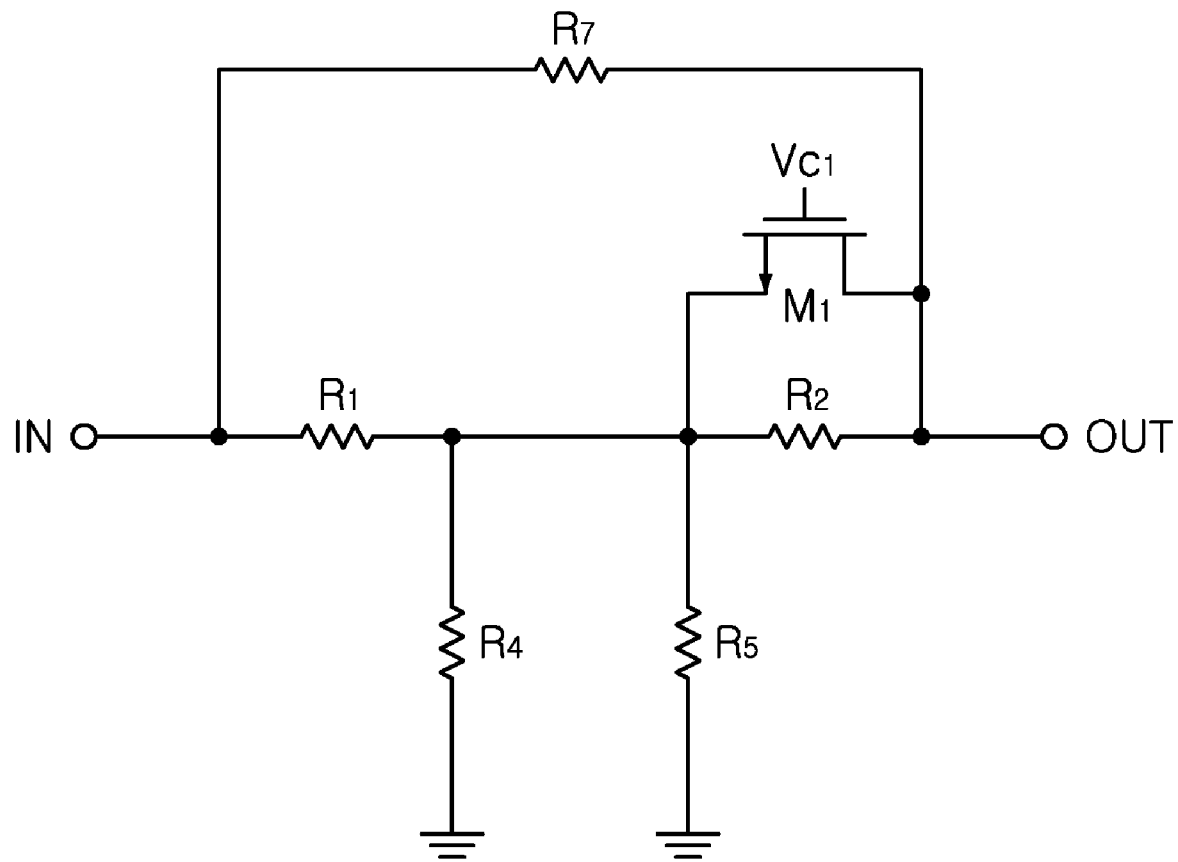
FIG. 5 is a circuit diagram illustrating a bridged-T type attenuator according to an exemplary embodiment of the present invention.

FIG. 5 is a circuit diagram illustrating a bridged-T type attenuator according to another exemplary embodiment of the invention. That is, in FIG. 5, in the embodiment of the invention, shown in FIG. 2, the second switch $M_2$ and the third switch $M_3$ are open-circuited and the fourth switch $M_4$ is short-circuited.

As shown in FIG. 5, when the second switch $M_2$ and the third switch $M_3$ are open-circuited, the fourth switch $M_4$ is short-circuited, and the first switch $M_1$ is open-circuited, the fourth resistor $R_4$ and the fifth resistor $R_5$ can be considered as one resistor in which the fourth and fifth resistors are connected in parallel with each other. Therefore, one bridged-T type attenuator can be realized. That is, in order to realize the bridged-T type attenuator, when the fourth switch $M_4$ is short-circuited, the first switch $M_1$ must be open-circuited.

Figure 6:
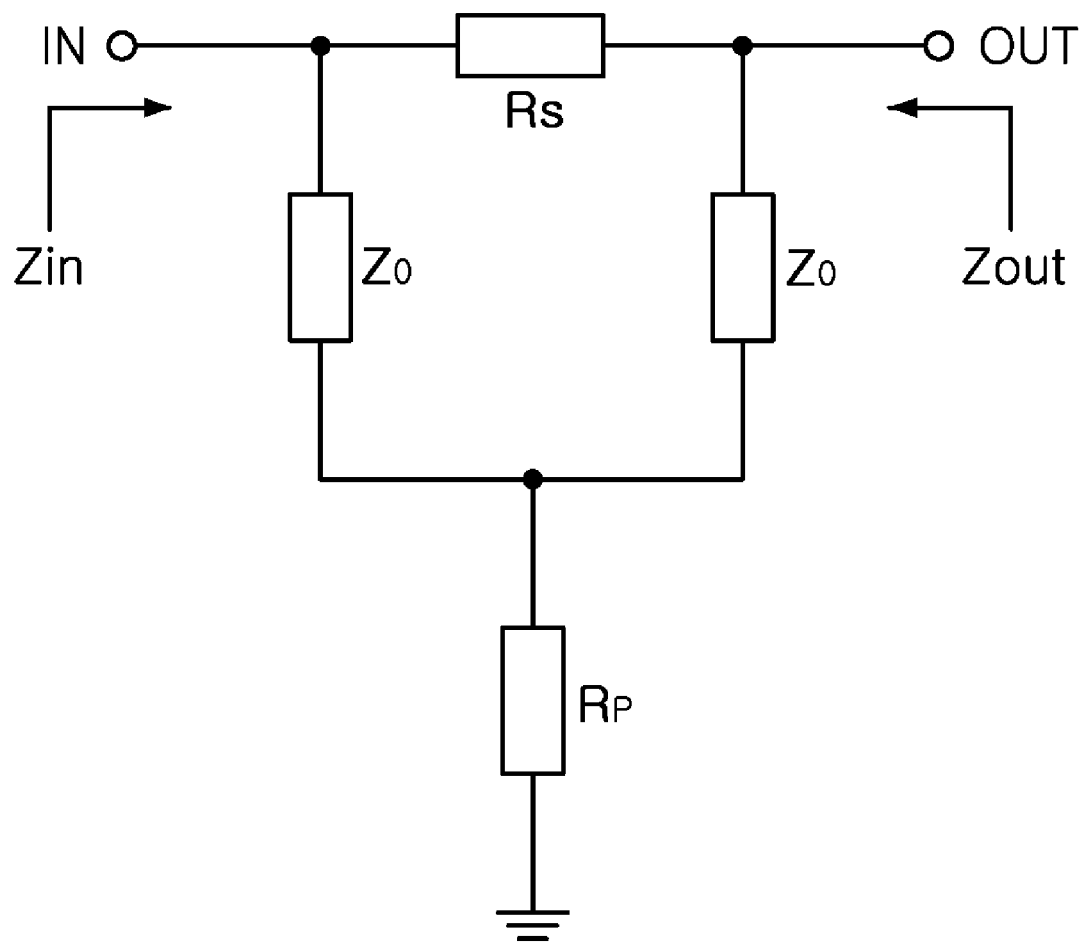
FIG. 6 is a diagram illustrating a method of determining a resistance according to an attenuation value of the bridged-T type attenuator.

FIG. 6 is a diagram illustrating a method of determining a resistance according to an attenuation value of a bridged-T type attenuator. Like FIG. 4, in FIG. 5, Zin and Zout indicate input and output impedance values, respectively. When a desired attenuation value and desired input and output impedance values are determined, individual resistances in the bridged-T type attenuator may be determined by the following Equations 5 and 6.

$$R_P = \frac{Z_0}{10^{\frac{L}{20}} - 1}$$ [Equation 5]

$$R_S = Z_0\left(10^{\frac{L}{20}} - 1\right)$$ [Equation 6]

In the above Equations 5 and 6, L indicates a desired attenuation value in dB, and $Z_0$ indicates circuit characteristic impedance in $\Omega$.

For example, the present inventors have designed the attenuator, shown in FIG. 3, so that the attenuator of FIG. 3 has an input and output impedance of 75$\Omega$ and the bridged-T type attenuator has an attenuation value of 5 dB. Each of the first resistor $R_1$ and the second resistor $R_2$ is determined to have a resistance of 67.2$\Omega$ when determining the attenuation values of the above-described Pi-type attenuators. In the same manner, each of the fourth resistor $R_4$ and the fifth resistor $R_5$ is determined to have a resistance of 196.2$\Omega$. Since the fourth resistor $R_4$ and the fifth resistor $R_5$ are connected in parallel with each other, a resistor having a resistance of 98.1$\Omega$ is practically connected between the ground terminal and a connection node between the first resistor $R_1$ and the second resistor $R_2$. The present inventors determine the seventh resistor $R_7$ to have a resistance of 58.4$\Omega$ to thereby obtain an attenuation amount of 5 dB.

As such, according to the embodiment of the invention, the second switch $M_2$ and the third switch $M_3$ are short-circuited and the fourth switch $M_4$ is open-circuited to thereby form two Pi-type attenuators connected in series with each other. Further, the second switch $M_2$ and the third switch $M_3$ are open-circuited and the fourth switch is short circuited to form the bridged-T type attenuator. Also, since the first switch $M_1$ is connected to one of the two Pi-type attenuators connected in series with each other to form a bypass path, it is possible to select only one of the two Pi-type attenuators. That is, the embodiment of the invention has a structure that includes one bridged-T type attenuator and two Pi-type attenuators. The bridged-T type attenuator may be used to obtain the lowest attenuation amount. The two Pi-type attenuators connected in series with each other may be used to obtain a larger attenuation amount.

Figure 7:
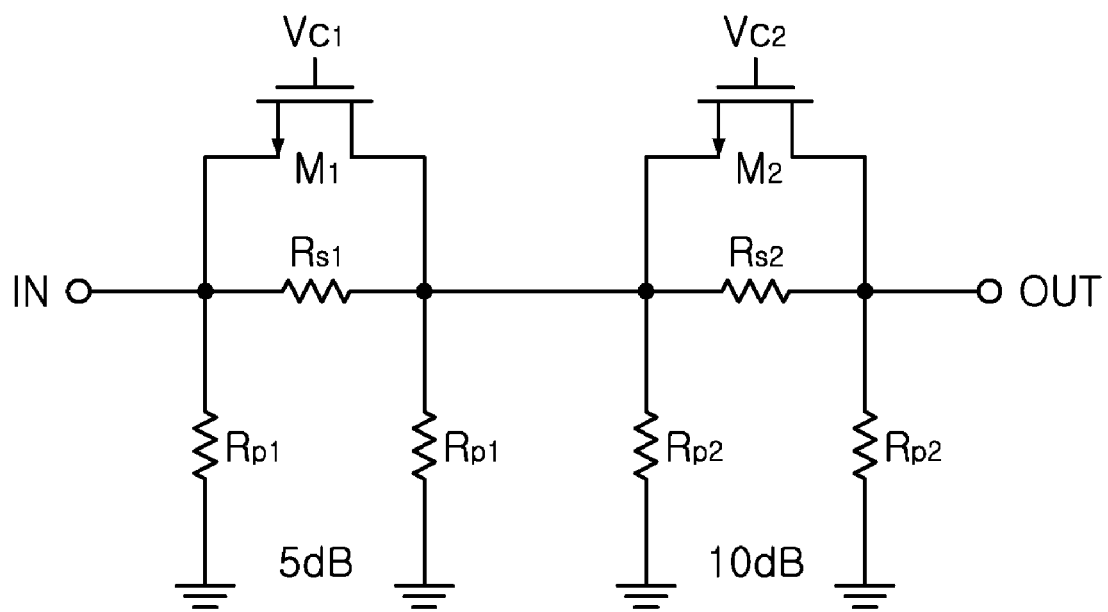
FIG. 7 is a circuit diagram illustrating a step attenuator according to the related art having Pi-type attenuators connected in series with each other.

In order to compare the step attenuator according to the related art with the step attenuator according to the embodiment of the invention, the present inventors have manufactured a step attenuator according to the related art in which Pi-type attenuators, shown in FIG. 7, connected in series with each other are formed by using MOS transistors having the same size as those of the embodiments of the invention. The step attenuator, shown in FIG. 7, is designed to have an input and output impedance of 75$\Omega$. The Pi-type attenuator connected to an input terminal IN is designed to have an attenuation amount of 5 dB. The Pi-type attenuator connected to an output terminal OUTPUT is designed to have an attenuation amount of 10 dB. Bypass switches $M_1$ and $M_2$ are separately provided to the Pi-type attenuators. That is, the step attenuator, shown in FIG. 7, has an attenuation of 5 dB when the switch $M_1$ is open-circuited and the switch $M_2$ is short-circuited, an attenuation of 10 dB when the switch $M_1$ is short-circuited and the switch $M_2$ is open-circuited, and an attenuation of 15 dB when the switch $M_1$ is open-circuited and the switch $M_2$ is open-circuited. To this end, it is designed that the Pi-type attenuator connected to the input terminal IN has a series resistor $R_{S1}$ having a resistance of 45$\Omega$ and two parallel resistors $R_{P1}$ each having a resistance of 265$\Omega$, and the Pi-type attenuator connected to the output terminal OUTPUT has a series resistor $R_{S2}$ having a resistance of 106$\Omega$ and two parallel resistors $R_{P2}$ each having a resistance of 144$\Omega$.

FIG. 8 is a diagram illustrating a result of a test on operating characteristics of the step attenuator according to the embodiment of the present invention shown in FIG. 2. FIG. 9 is a diagram illustrating a result of a test on operating characteristics of the step attenuator shown in FIG. 7.

Figure 8A:
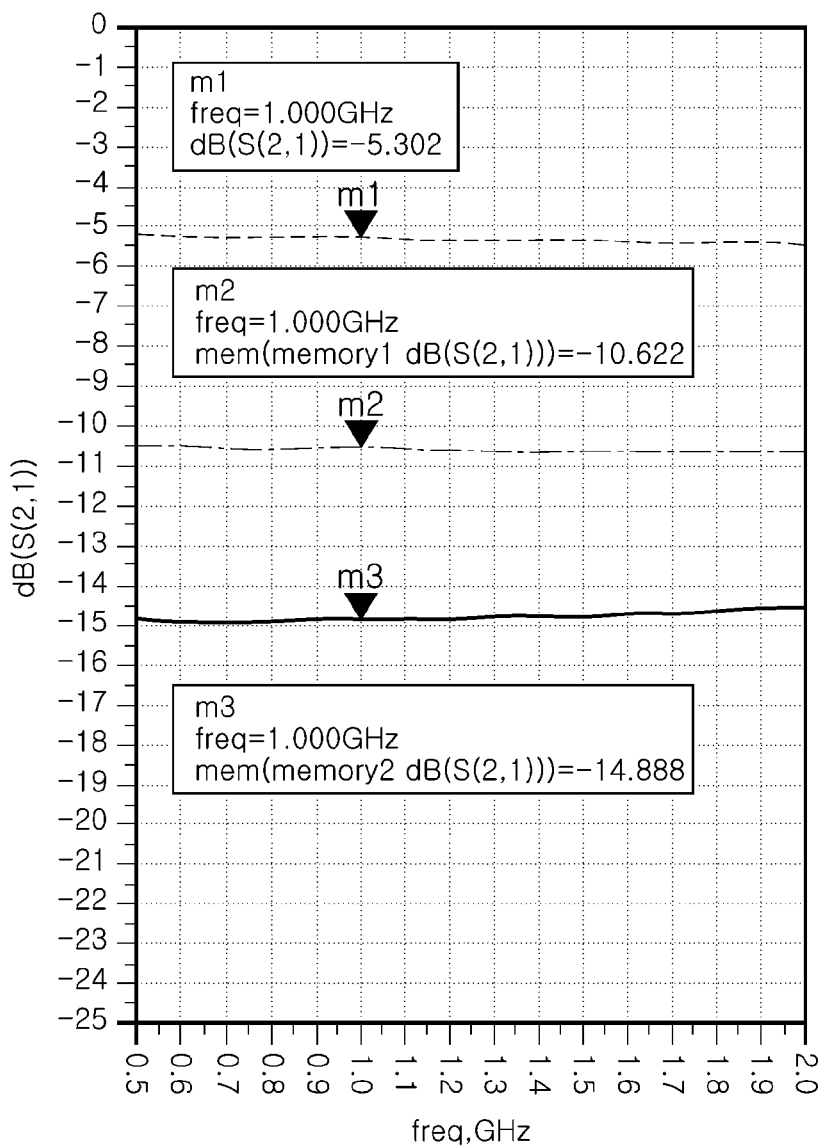
FIGS. 8A-8B are diagrams illustrating a result of a test on operating characteristics of a step attenuator according to an exemplary embodiment of the present invention.
Figure 9A:
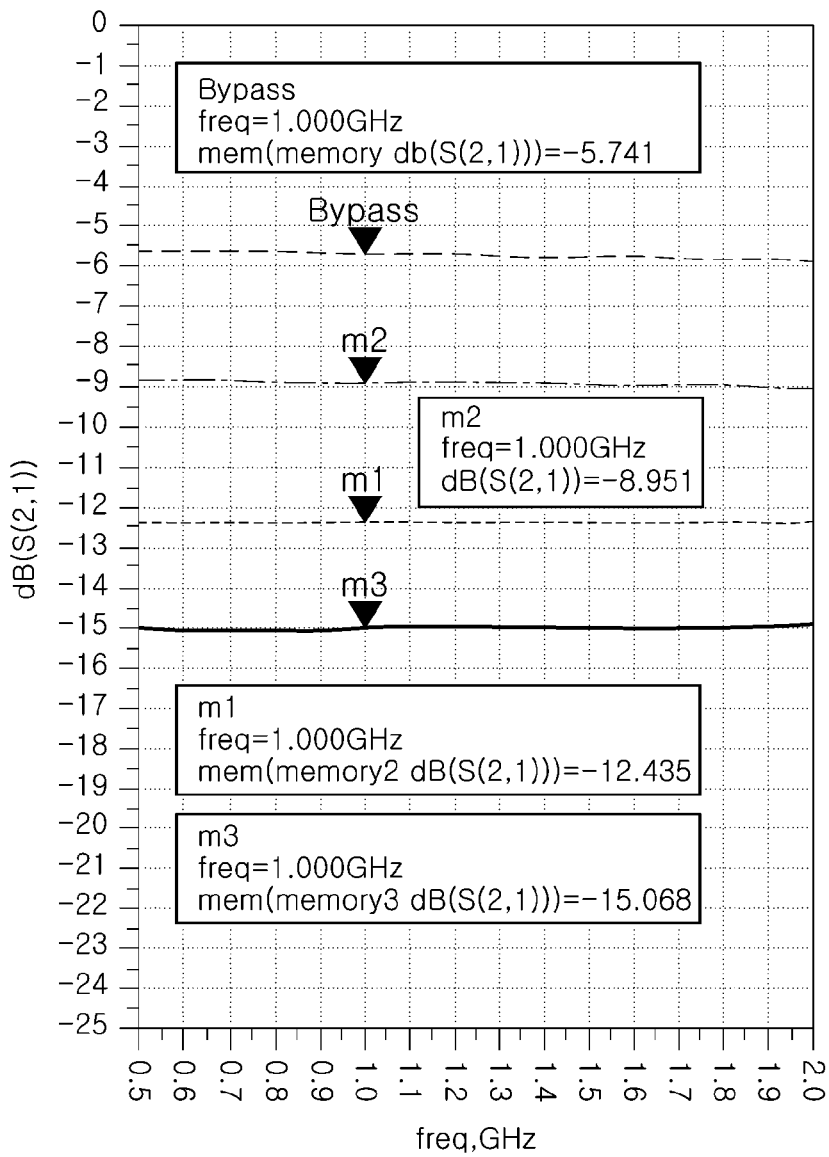
FIGS. 9A-9B are diagrams illustrating a result of a test on operating characteristics of the step attenuator shown in FIG. 7.

As shown in FIG. 8A, the step attenuator according to the embodiment of the invention has attenuation amounts of 5.302 dB, 10.622 dB, and 14.888 dB at a frequency of 1 GHz when the step attenuator has the attenuator configuration (FIG. 3 and FIG. 5) that can obtain desired attenuation amounts of 5 dB, 10 dB, and 15 dB. However, as shown in FIG. 9A, the step attenuator according to the related art has an attenuation amount of 5.741 dB when both of the switches $M_1$ and $M_2$ are short-circuited, an attenuation amount of 8.951 dB when the switch $M_2$ is only open-circuited, an attenuation amount of 12.435 dB when the switch $M_1$ is only open-circuited, and an attenuation amount of 15.068 dB when both of the switches $M_1$ and $M_2$ are open-circuited.

Figure 8B:
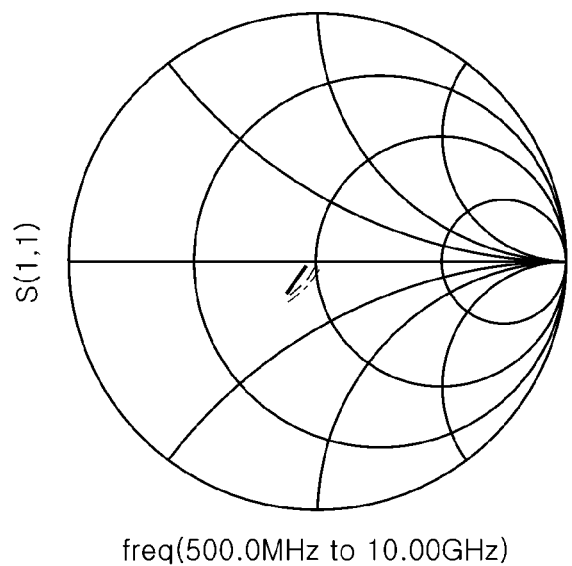
Figure 9B:
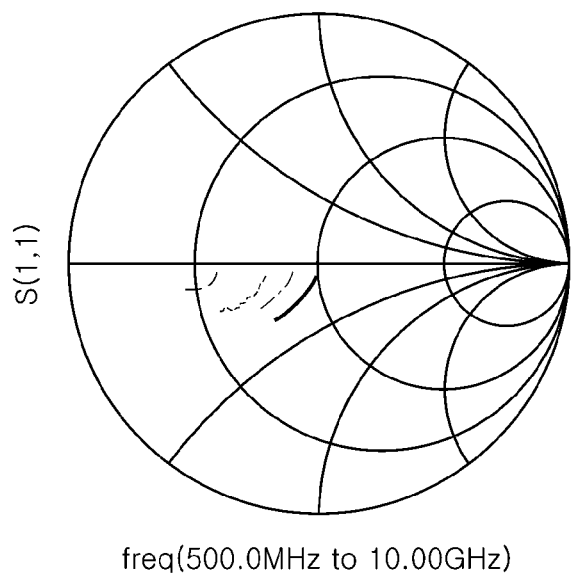

When input matching characteristics are compared, as show in FIG. 8B, the step attenuator according to the embodiment of the invention has impedance near the center of the Smith chart with respect to all of the attenuation amounts, that is, an impedance of 75Ω. On the other hand, as shown in FIG. 9B, as the step attenuator according to the related art has a smaller attenuation amount, the attenuator has impedance far from 75Ω, and input mismatch can be found.

As such, the step attenuator according to the related art is heavily influenced by accuracy in attenuation amount by the switches formed of the MOS transistors provided for bypass, and thus may cause input and output mismatch. However, the attenuator according to the embodiment of the invention obtains accuracy in attenuation amount and maintains input and output matching.

As set forth above, according to the exemplary embodiments of the invention, the step attenuator having two Pi-type attenuators and one bridged-T type attenuator that share some resistors is used to prevent a reduction in frequency range caused by use of MOS transistors and reduce attenuation of signal power and frequency band by the MOS transistors, thereby obtaining a low attenuation value and reducing input and output mismatch.

While the present invention has been shown and described in connection with the exemplary embodiments, it will be apparent to those skilled in the art that modifications and variations can be made without departing from the spirit and scope of the invention as defined by the appended claims.

What is claimed is:

1. A step attenuator comprising:
   first and second resistors connected in series with each other between an input terminal and an output terminal;
   a first switch connected in parallel between both ends of one of the first and second resistors;
   a second switch having one end connected to the input terminal;
   a third resistor having one end connected to the other end of the second switch and the other end connected to a ground terminal;
   fourth and fifth resistors having one set of ends connected to a connection node between the first resistor and the second resistors and other set of ends connected to a ground terminal; and
   a third switch having one end connected to the output terminal;
   a sixth resistor having one end connected to the other end of the third switch and the other end connected to the ground terminal;
   a fourth switch having one end connected to one of the input terminal and the output terminal; and
   a seventh resistor having one end connected to the other end of the fourth switch and the other end connected to one terminal between the input and output terminals while the one terminal is not connected to the fourth switch.

2. The step attenuator of claim 1, wherein both of the second switch and the third switch are open-circuited or short-circuited, and the fourth switch is short-circuited or open-circuited in opposition to the second switch and the third switch.

3. The step attenuator of claim 1, wherein the first switch is open-circuited when the fourth switch is short-circuited.

4. The step attenuator of claim 1, wherein the first resistor and the second resistor have the same resistance.

5. The step attenuator of claim 1, wherein the third to sixth resistors have the same resistance.

6. The step attenuator of claim 1, wherein the first to third switches are MOS transistors.

* * * * *